US005729896A

United States Patent [19]
Dalal et al.

[11] Patent Number: 5,729,896
[45] Date of Patent: Mar. 24, 1998

[54] METHOD FOR ATTACHING A FLIP CHIP ON FLEXIBLE CIRCUIT CARRIER USING CHIP WITH METALLIC CAP ON SOLDER

[75] Inventors: Hormazdyar M. Dalal, Milton; Kenneth M. Fallon, Vestal; Gene J. Gaudenzi, North Salem; Cynthia S. Milkovich, Vestal, all of N.Y.

[73] Assignee: International Business Machines Corporation, Armonk, N.Y.

[21] Appl. No.: 740,571

[22] Filed: Oct. 31, 1996

[51] Int. Cl.$^6$ .............................. H05K 3/34; H05K 13/04
[52] U.S. Cl. .............................. 29/840; 29/836; 29/841; 228/180.22; 257/772; 257/737; 174/260
[58] Field of Search .............................. 29/834, 836, 840, 29/841; 156/247; 174/260, 263; 228/180.21, 180.22, 254, 256; 257/737, 738, 772, 778; 439/67, 77

[56] References Cited

U.S. PATENT DOCUMENTS

| | | | |
|---|---|---|---|
| 4,967,950 | 11/1990 | Legg et al. | 228/180.22 |
| 5,075,965 | 12/1991 | Carey et al. | 29/840 |
| 5,130,779 | 7/1992 | Agarwala et al. | 257/772 |
| 5,238,176 | 8/1993 | Nishimura | 228/256 |
| 5,251,806 | 10/1993 | Agarwala et al. | 228/180.22 |
| 5,289,631 | 3/1994 | Koopman et al. | 29/840 |
| 5,297,333 | 3/1994 | Kusaka | 29/840 |
| 5,384,952 | 1/1995 | Matsui | 29/840 |
| 5,435,732 | 7/1995 | Angulus et al. | 29/840 X |
| 5,478,420 | 12/1995 | Gauci et al. | 156/247 X |
| 5,489,750 | 2/1996 | Sakemi et al. | 174/260 X |
| 5,615,477 | 4/1997 | Sweitzer | 228/180.22 X |
| 5,634,268 | 6/1997 | Dalal et al. | 228/180.22 X |

FOREIGN PATENT DOCUMENTS

| | | | |
|---|---|---|---|
| 62-117346 | 5/1987 | Japan | H01L 21/92 |
| 4017390 | 1/1992 | Japan | 29/840 |
| 4099393 | 3/1992 | Japan | 29/840 |
| 4297091 | 10/1992 | Japan | 29/840 |
| 5152733 | 6/1993 | Japan | 29/840 |

OTHER PUBLICATIONS

Dawson, et al., "Indium–Lead–Indium Chip Joining", IBM Technical Disclosure Bulletin, vol. 11, No. 11, Apr. 1969, p. 528.

Microelectronics Packaging Handbook, edited by Rao R. Tummala and Eugene J. Rymaszewski, pp. 366–391 (1989).

Milkovich et al., "Double Sided Flexible Carrier with Discretes and Thermally Enhanced FCA/COF", IEEE 43rd ECTC Proceedings, Jun. 1993, pp. 16–21.

Milkovich et al., U.S. Patent Application Serial No. 08/071,630, entitled "Manufacturing Flexible Circuit Board Assemblies with Common Heat Spreaders", filed on Jun. 3, 1993.

Fallon et al., U.S. Patent Application Serial No. 08/387,686, entitled "Process for Selective Application of Solder to Circuit Packages", filed on Feb. 13, 1995, now U.S. Patent No. 5,597,469.

*Primary Examiner*—Peter Vo
*Attorney, Agent, or Firm*—Aziz M. Ahsan

[57] ABSTRACT

A structure and method is disclosed for directly attaching a device or package on flexible organic circuit carriers having low cost and high reliability. IC chips with a new solder interconnect structure, comprised of a layer of pure tin, deposited on the top of high melting Pb—Sn solder balls are employed for joining. These methods, techniques and metallurgical structures enables direct attachment of electronic devices of any complexity to any substrate and to any level of packaging hierarchy. Also, devices or packages having other joining technologies, eg. SMT, BGA, TBGA, etc. could be joined onto the flexible circuit carrier.

37 Claims, 4 Drawing Sheets

METHOD FOR ATTACHING A FLIP CHIP ON FLEXIBLE CIRCUIT CARRIER USING CHIP WITH METALLIC CAP ON SOLDER

CROSS-REFERENCE TO RELATED PATENT APPLICATIONS

This patent application is related to U.S. patent application Ser. No. 08/476,475, entitled, "METHOD FOR FORMING REFLOWED SOLDER BALL WITH LOW MELTING POINT METAL CAP", filed on Jun. 7, 1995 now abandoned, U.S. patent. application Ser. No. 08/476,474, entitled, "REFLOWED SOLDER BALL WITH LOW MELTING POINT METAL CAP", filed on Jun. 7, 1995 now abandoned U.S. patent application Ser. No. 08/476,466, now U.S. Pat. No. 5,634,268 entitled, "METHOD FOR MAKING DIRECT CHIP ATTACH CIRCUIT CARD", filed on Jun. 7, 1995, and U.S. patent application Ser. No. 08/476, 472, entitled, "DIRECT CHIP ATTACH CIRCUIT CARD", filed on Jun. 7, 1995, presently assigned to the assignee of the instant application and the disclosure of which is incorporated herein by reference.

FIELD OF THE INVENTION

The present invention relates generally to an improved and cost saving Direct Chip Attach (DCA) on Flexible circuit carriers using Flip Chip Attach (FCA) technology. More particularly, the invention encompasses a structure where at least one Integrated Circuit Chip can be directly attached to a flexible substrate. This direct attachment can be done using C4 (Controlled Collapsed Chip Connection) technology by capping the already reflowed solder balls and forming a eutectic solder composition. A method for such direct chip attachment to the flexible card is also disclosed.

BACKGROUND OF THE INVENTION

Semiconductor devices are becoming smaller and more dense with the evolution of new technology. However, increases in circuit density produce a corresponding challenge to improve chip and chip connections in order to remain competitive. Whereas significant process improvements are being made by reducing process variability, process improvements alone are not sufficient to increase both yield and reliability of these products. Further, the packaging technology has not been able to keep pace with IC (Integrated Circuit) chip miniaturization for performance improvements.

Electronic products typically comprise of plurality of components. The packaging of these components follow a hierarchy where an Integrated Circuit (IC) chip comprising of semiconductor micro-devices are connected (1st level assembly) to carriers made of ceramic or organic laminates comprising one or several layers of metal interconnection lines. These carriers may also contain some other discrete devices like capacitors, resistors etc. Thus assembled carriers with IC chips, along with some kind of sealing and cooling methodology, are called modules.

These modules, in turn, are connected to cards (2nd level assembly) usually made of organic laminates with printed circuits on either side of the card.

These cards are then connected to boards (3rd level assembly). Such 3 levels of hierarchy is required in many electronic applications, such as, in computer CPUs where performance of complex functions is required.

Increased integration in present day IC chips require product miniaturization by eliminating first, second or both levels of packaging. For example, in Direct Access Storage Discs (DASD), read/write functions provided by a static region, comprised of IC chips on an input card, are cross linked to a dynamic region, comprised of memory discs, via Flexible Printed Circuit Boards. A close proximity of static and dynamic regions is required to increase the performance of such DASD. This requires direct bonding of IC chips on Flexible circuit carrier connected to the disc drive.

The Tape Automated Bonding (TAB) is the most common method presently used for chip attachment on Flexible circuit carrier because it is also the most common method for first level packaging and it is suitable for mounting on flexible base.

However, TAB is not capable of taking full advantage of the Very Large Scale Integration which not only requires close spacing of I/O pads but also requires an array pattern to accommodate the vast number of I/O pads.

The TAB itself is a first level of packaging, hence TAB mounting of chips on Flexible circuit carrier precludes it from the Direct Chip Attach technology.

Another shortcoming of TAB is that it requires additional space to accommodate the wire leads, this limits its capability in bringing the static and dynamic regions close enough.

Yet another limiting factor for use of TAB is difficulty in testing and/or burning-in of these mounted chips; this limits the yield thus making the product expensive.

Still yet another shortcoming is that rework is economically unfeasible.

These limitations necessitate use of a C4 like technology for joining chips on circuit careers.

The C4 or Controlled Collapse Chip Connection technology has been successfully employed for 1st level assembly of chip on ceramic carriers. The C4 technology is described in detail by many authors, see for example, Microelectronics Packaging handbook, edited by, Rao R. Tummala and Eugene J. Rymaszewski, pages 366–391 (1989), the disclosure of which is incorporated herein by reference.

The C4 interconnection is comprised of two main elements, a solder wettable pad called Ball Limiting Metallurgy (BLM), and a ball of solder. The BLM is comprised of an adhesive layer like Cr or TiW, and a solder reflowable layer like copper or nickel. The BLM materials and their thicknesses are judiciously chosen to provide good and reliable electrical, mechanical and thermal stability to interconnect structure. The solder material used for C4 is preferably a low percentage (about 2 percent to about 10 percent) tin alloyed with lead. This combination is used:

(i) to prevent melting of the reflowed solder ball or C4 during the next level of packaging interconnection, (ii) to reduce reaction between copper of BLM and tin, as high stresses resulting from excessive copper-tin intermetallic imparts a high stress concentration on underlaying passivation, and, (iii) for better thermal fatigue characteristic offered by lower Sn (tin) percentage.

Presently, there are two problems that limit the use of current C4 technology for 2nd or higher level assembly, or, for Direct Chip Attach on card. First it limits the interconnection to Pin-Through-Hole (PTH) technology and precludes the use of space saving Surface Mount Technology (SMT), because a joining temperature higher than melting point of the SMT solder is required. Second, the relatively high joining temperature (between about 340° C. to about 380° C.) precludes the use of organic card material.

There are two ways to lower the joining temperature for DCA. One approach is to provide an eutectic (or lower melting) solder on a card metallization. A method pertaining to this approach is described in U.S. Pat. No. 4,967,950 to Legg and Schrottke, which is presently assigned to the assignee of the instant patent application. Legg and Schrottke describes a general scheme for attaching IC chips to flexible substrate (laminate) using C4s. The substrate is "tinned" with an alloy of eutectic composition in its contact region with the solder balls on the base of the chip.

The method of pre-coating the card, or an organic carrier, by eutectic solder is taught by Fallon et al., U.S. patent application Ser. No. 08/387,686, entitled "Process for Selective Application of Solder to Circuit Packages", filed on Feb. 13, 1995 now U.S. Pat. No. 5,597,469, and the disclosure of which is incorporated herein by reference. In this method, eutectic solder is electroplated on copper conductors of printed circuit card precisely where the Chip C4 bumps would make contact.

Another method of pre-coating the card, or an organic carrier, by eutectic solder is taught by Nishimura, U.S. Pat. No. 5,238,176, entitled "Method and apparatus for forming bump", assigned to the assignee of the instant patent application, and the disclosure of which is incorporated herein by reference. In this method, precise amount of eutectic solder, in liquid state, is injected at sites on copper conductors of laminated circuit card through an injector head having openings pertaining to the card part number used. The above methods are limited to rigid substrates.

A method for flexible substrates, which matches the Legg and Schrottke's scheme of "tinning" the substrate with eutectic alloy, is shown by Milkovich et al., in U.S. patent application Ser. No. 08/071,630, entitled "Manufacturing Flexible Circuit Board Assemblies with Common Heat Spreaders", filed on Jun. 3, 1993, and assigned to the assignee of the instant patent application, and the disclosure of which is incorporated herein by reference. In this method, "decals" of eutectic solder balls with required footprint are first formed which is subsequently transferred on the flexible circuit carrier. Decals are formed by electroplating solder balls on a stainless steel plate. This method requires a photo-imageable solder mask on the Flexible circuit carrier circuit, holes corresponding to the required footprint are developed out in this mask. The decals are transferred by placing the flipped stainless steel plate on flexible circuit carrier card and reflowing. Flexible printed circuit cards are typically made of polyimides, for example Pyralux (Trade Mark of E.I. duPont de Nemours & Co., Inc.). Using this technique, Milkovich et al., "Double Sided Flexible Carrier with Discretes and Thermally Enhanced FCA/COF" IEEE 43rd ECTC Proceedings, June 1993, pages 16–21, have demonstrated methods of circuitization and device attachments on both sides of the flexible circuit carrier; the disclosure of which is incorporated herein by reference. One of the disadvantage of this method is poor yield.

A second approach for lowering the joining temperature for Direct Chip Attach (DCA), is to provide a low melting Solder On Chip (SOC) C4 rather than on the carrier conductor. Carey et al., in U.S. Pat. No. 5,075,965 and Agarwala et al., in U.S. Pat. Nos. 5,251,806 and 5,130,779, which are presently assigned to the assignee of the instant patent application, and Japanese Patent Publication No. 62-117346 to Eiji et al., describe various schemes to provide low melting solder on chips. Carey et al., in U.S. Pat. No. 5,075,965, disclose a method, where an inhomogeneous, anisotropic column consists of lead rich bottom and tin rich top of sufficient thickness to form eutectic alloy. The resulting as-deposited and un-reflowed column is then joined onto the card's conductor.

To circumvent the thermodynamically driven tendency for interdiffusion, Agarwala et al., in U.S. Pat. Nos. 5,251, 806 and 5,130,779, showed a structure where the low melt component is separated from the high melt component by interposing a barrier metal layer. This structure does show a hierarchy of solder material, however, in this structure the column of high melting solder never get reflowed. Because, the stacked solder does not get reflowed there is no metallurgical reaction between the solder stack and the adhesive pad of BLM which is known to cause poor mechanical integrity of the C4 joint.

Eiji et al., in Japanese Patent Publication No. 62-117346, describes an anisotropic column structure of low and high melting solders. The basic objective of this invention is essentially to provide an increase height of a solder joint rather than to provide a low melting solder joining process. In Eiji et al., a high-melting point metallic layer is secured to a chip and a substrate and a low-melting point metallic layer is then formed, the two low-melting point metallic layers are then joined and thereby the chip is joined to the substrate.

IBM Technical Disclosure Bulletin, entitled "Indium-Lead-Indium Chip Joining", W. A. Dawson et al., vol. 11, No. 11, page 1528 (April 1969), discloses the standard capping of lead with either indium or tin for diffusion bonding. In order to alleviate the problem of chip collapse onto the surface of the substrate an intermediate temperature is employed.

For the purpose of this invention a bump completely composed of low melting composition is a feature to be avoided as the high tin content reacts with all of the copper of the adhesive layer (BLM) giving a thick intermetallic layer. High stresses of reacted BLM have been known to cause solder pads to fall off and to create insulation cracking. The eutectic solder bumps also have poor electromigration and thermal fatigue lifetime. It is also known that low melting eutectic solder suffers from void formation due to thermal migration which causes circuit failure.

Yet another drawback of inhomogeneous, anisotropic solder column is that this structure is unfavorable for electrical tests of circuitry before joining the chips on carriers as the electrical probes gouge into the low melt cap during testing and destroy the cap. Furthermore, for the chip burn-in it is also not feasible to use any of the known multilayered solder balls, as the temperature that is generally used is between about 120° C. And about 150° C. for burn-in which will cause inter diffusion of the low and the high melt components even before the joining operation begins.

This invention relates generally to interconnection in electronic circuit packages, and more particularly shows a new solder interconnection technology to make a Direct Chip Attachment (DCA) on Flexible organic circuit carrier.

According to the present invention a method is provided for preparing the flexible circuit carrier card for direct device attachment using low melting Solder On Chip (SOC) where the low melting eutectic alloy is formed during joining operation and is localized at the tip of the standard high melting C4 ball.

PURPOSES AND SUMMARY OF THE INVENTION

The invention is a novel method and structure for providing direct device attach to flexible circuit card using a novel solder interconnection scheme.

Accordingly, it is a purpose of the present invention to provide a method for preparing the flexible circuit carrier card for direct device attachment using a novel solder interconnection scheme.

Another purpose of this invention is to provide a method for simultaneously joining devices on Flexible card using the DCA/SOC, the method of the instant, along with various Flip Chip, SMT and/or BGA (Ball Grid Array) technologies.

It is a further purpose of the present invention to provide a method of directly attaching one or more of devices using one or more of joining technologies and having flexibility to discretely remove and replace devices joined with various technologies.

Another purpose of this invention is to provide a Flexible circuit card/device assembly which has increased performance.

Yet another purpose of this invention is to provide for a Flexible circuit carrier card which is low in cost, easy to build and possesses high reliability.

Still yet another purpose of this invention is to provide a Flexible circuit carrier card with mounted devices which has low profile, is compact in design and has low weight.

Yet another purpose of this invention is to have a Flexible card which is compatible with wafer level electrical test and burn-in.

Therefore, in one aspect this invention comprises a method of directly attaching an electronic device onto a flexible circuit carrier, said method comprising the steps of:

(a) providing said electronic device with at least one reflowed solder ball, wherein said reflowed solder ball has at least one coating of at least one low melting point metal to form a metallic cap, (b) adhering at least one layer of at least one stiffener sheet with at least one thermo-plastic adhesive onto at least one surface of a flexible sheet, (c) forming at least one electrically conductive metal line on said at least one surface of said flexible sheet, (d) coating at least a portion of said flexible carrier with at least one insulator material, and removing selective portions of said insulator material and exposing selective portions of said metal line, and forming a flexible circuit carrier, (e) screening eutectic solder paste to coat selective sites on said flexible circuit carrier, (f) placing said flexible circuit carrier on an assembly fixture to hold said flexible circuit carrier, (g) dispensing at least one solder flux at selective sites on said flexible circuit carrier, (h) aligning and placing said electronic device onto said flexible circuit carrier, such that reflowed solder ball with metallic cap makes contacts with said solder flux, and upon heating forms an electrical connection between said electronic device and said flexible circuit carrier.

In another aspect this invention comprises a flexible electronic carrier comprising a flexible device carrier and at least one electronic device electrically connected thereto by at least one solder ball, wherein said solder ball has a cap of at least one low melting point cap forming a eutectic.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

The invention basically encompasses a flexible circuit carrier with metallic conductor lines, such as, copper. Openings are made at sites which will be electrically connected to an electronic device using reflowed solder with a metallic cap. Ashing of the surface of the flexible circuit carrier could also be done to improve the adhesion and the flow of encapsulants. Solder paste could be screened for SMT, solder balls could be placed for BGA, or, solder could also be placed by solder injection for various flip chip attach methods. Likewise, either one or both surfaces of the flexible circuit carrier could be prepared to secure various electronic devices.

The invention also encompasses the formation of a direct chip attach (DCA) on the flexible circuit carrier surface. This is done by aligning the solder interconnections with a cap of low melting point metal on the chip with the corresponding footprints on the flexible circuit carrier. The assembly is then held at a bias temperature of about 150° C. And then individual chips are heated, preferably with Infra Red (IR) heat source to a temperature of between about 190° C. To about 220° C. in a nitrogen or a forming gas environment. The assembly is then cooled and the chip is preferably encapsulated with an epoxy based encapsulant, such as, HYSOL 4511, Trade Name used by Dexter Hysol of California, USA.

An advantage of this invention is the fact that the method is applicable for all levels of packaging, i.e., for highest level packaging, involving chip joining to motherboard or flexible circuit carrier cards or PCMCIA (Personal Computer Memory Card International Association) cards.

This invention basically came about as an unexpected result which showed that low melting point solder that is deposited atop a reflowed solder mass alloys only with enough solder mass to form a volume of eutectic alloy. It was also found that relatively little or no further interdiffusion took place even after multiple times of eutectic melting cycles. This is believed to be due to that fact that the amount of low melting point atop the solder mass was equivalent to eutectic composition for the deposited mass of low melting point metal. Thus, a desired volume of eutectic liquid atop a solid solder mass is formed without any need for a barrier. A volume of eutectic liquid remains present, whenever the joint temperature is raised to eutectic temperature, even after joining on copper interconnections of circuit carrier; this liquid formation at the joint interface presents an ideal condition for easy removal of the joined chip for the purposes of chip replacement without mechanically or thermally affecting other components on the board.

As stated earlier that the solder interconnections using solder balls having a cap of low melting point metal allows for making a low temperature chip attachment directly to any of the higher levels of packaging substrates. After the solder ball has been formed using standard methods it is reflowed to give the solder ball a smooth surface. A layer of metal, such as tin, preferably, pure tin, is deposited on the top of the solder balls. This structure results in localizing of the eutectic alloy, formed upon subsequent low temperature joining cycle, on top of the solder ball even after multiple low temperature reflow cycles.

This method does not need tinning of the carrier or substrate to which the chip is to be joined, which makes this method economical.

It has also been noticed that whenever temperature is raised slightly above the eutectic temperature, the structure always forms a liquid fillet around the joint with copper wires. This liquid fillet formation results in substantial thermal fatigue life improvement for reduced stress at interface; and secondly, provides an easy means to remove chip for the purpose of chip replacement and field repairs.

These methods, techniques and metallurgical structures enables direct attachment of devices of any complexity to any substrate and to any level of packaging hierarchy; thereby, making the products more economical and more compact as well as resulting a better performance.

Figure 1:
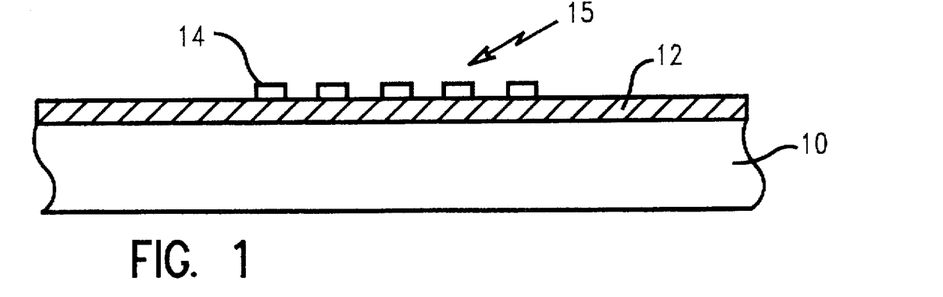
FIG. 1, shows a cross-section of a flexible circuit carrier substrate having at least one flexible sheet with at least one circuit on at least one surface.

Referring now to the drawings, wherein like reference numerals represent the same or similar parts throughout, FIG. 1, shows a flexible sheet 10, preferably a polyamide based flexible material, on which at least one metallic line, such as a copper film, is laminated using at least one first thermo-plastic adhesive 12, and then the copper film is circuitized to form a plurality of circuits 14. The flexible sheet 10, could be selected from a group comprising organic substrate, multi-layer organic substrate, ceramic substrate or multi-layer ceramic substrate, to name a few. To those skilled in the art, it should be apparent that the circuit carrier substrate 15, could be made with interlevel wiring (not shown) of one or more layers, and/or wiring channels on either or both surfaces. For the ease of understanding circuits 14, are only shown on one surface.

Figure 2:
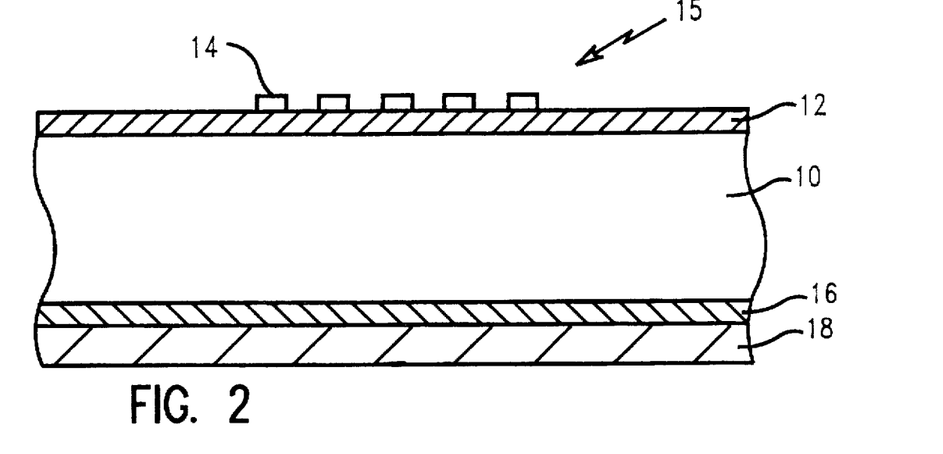
FIG. 2, shows a cross-section of the flexible circuit carrier substrate of FIG. 1, after a stiffener has been secured using at least one adhesive.

After the circuit carrier substrate 15, has been formed, at least one stiffener 18, such as a metal foil 18, or for example, an aluminum foil 18, is laminated on the backside of the circuit carrier substrate 15, using at least one second thermoplastic adhesive 16, as more clearly shown in FIG. 2. It is preferred that the thickness of the stiffener 18, is at least about 2 mil, and preferably between about 3 mil to about 5 mil. At least one of the layers for the stiffener 18, could be selected from a group comprising aluminum, molybdenum, silicon, tantalum or titanium, to name a few.

Figure 3:
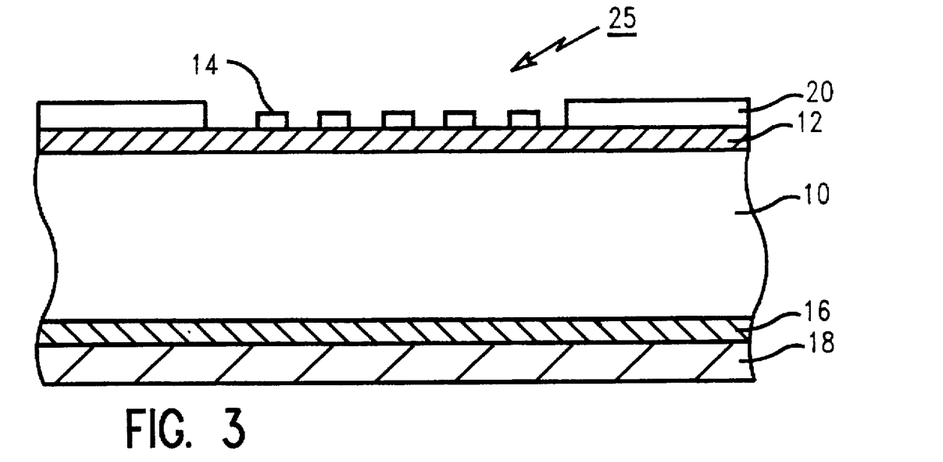
FIG. 3, shows a cross-section of the flexible circuit carrier substrate after at least one layer of an organic material has been adhered adjacent to the circuits.

As shown in FIG. 3, a photo-imageable organic material 20, such as, for example, PSR4000 (Trade Name used by Taiyo Co., Japan), is then screened on top of the circuit carrier substrate 15, and pre-baked at 80° C. The use of PSR4000 is optional. For the method of the present invention, the solder mask is not required. PSR4000 is used here to demonstrate its need to act as solder dam to prevent lateral flow of solder. The organic material 20, is then exposed and developed.

The organic material 20, is next cured at 150° C. This curing process opens a large area, corresponding to the device size. Holes corresponding to foot print of C4 solder balls on IC chips are opened for devices to be joined. This produces a flexible ribbon or card 25, as clearly shown in FIG. 3.

Figure 4:
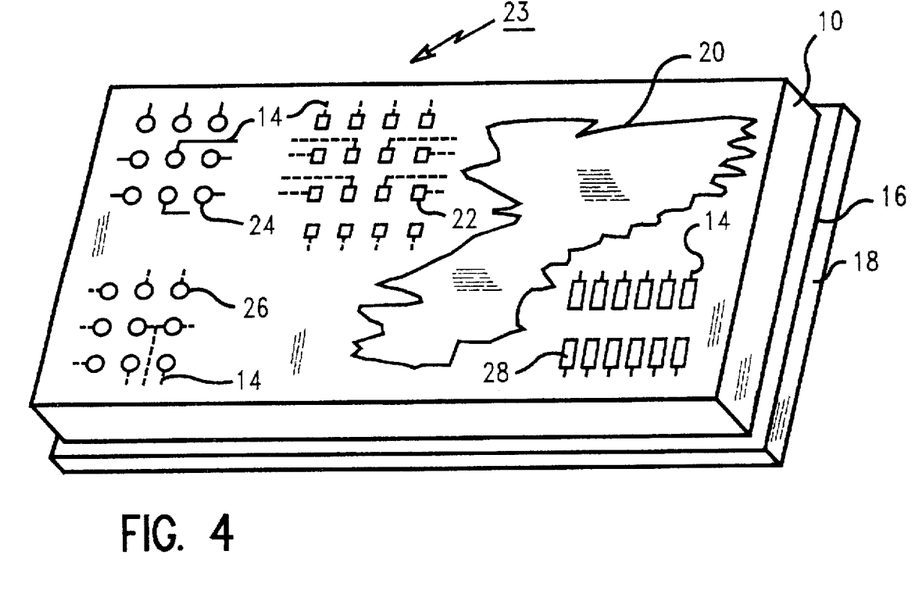
FIG. 4, shows a flexible circuit carrier that has been site-dressed for joining at least one electronic device.

FIG. 4, shows the top view of a flexible circuit carrier 23, having wires or circuits 14, and electrical interconnections 22, 24, 26 and 28, to receive electronic devices with various joining technologies. For example, interconnection 22, could be a pad 22, which is used for joining of DCA/SOC, interconnection 24, could be solder 24, that has been placed using a solder injection method for FCA (Flip Chip Attach). Similarly, interconnection 26, could be screened solder 26, such as BGA (Ball Grid Array) 26, and interconnect 28, could be screened solder 28, for SMT (Surface Mount Technology), etc.

The surface of the organic material 20, can optionally be oxygen ashed at about 130 mT pressure for about 30 minutes. This roughens the surface of the organic material 20, and this surface roughness improves the flowability of chip encapsulant which are used later.

Figure 5:
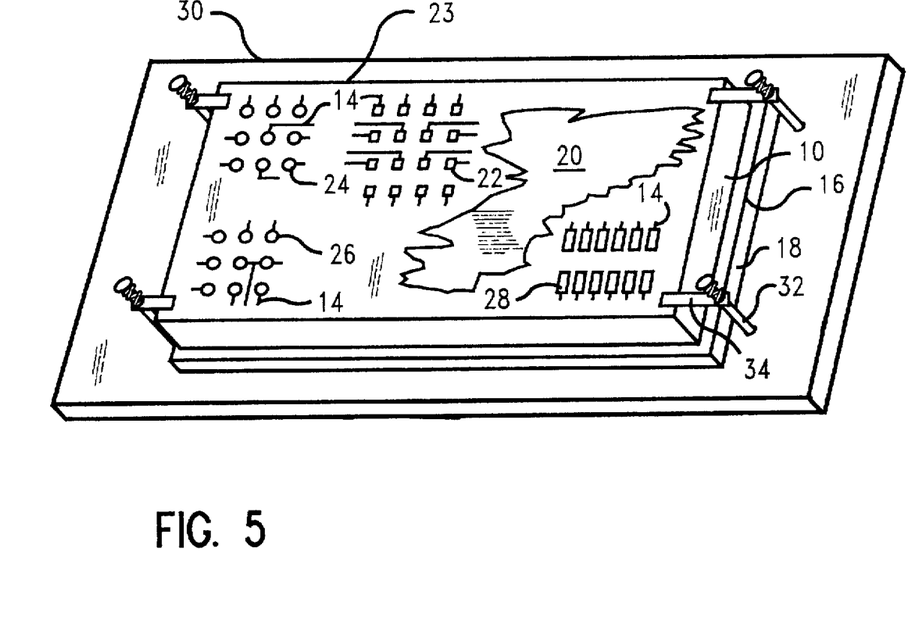
FIG. 5, shows the securing of the flexible circuit carrier of FIG. 4, onto a support jig.

FIG. 5, shows the flexible circuit carrier 23, after it is placed on a specially designed fixture or jig 30. The jig or fixture 30, is preferably made of a glass re-enforced thermosetting polymer. The purpose of this jig or fixture 30, is to ensure planarity of the flexible circuit carrier card 23, during reflow operations. The flexible circuit carrier 23, is securely held at the four corners on the jig or fixture 30, using spring loaded clamps 32 and 34.

Figure 6:
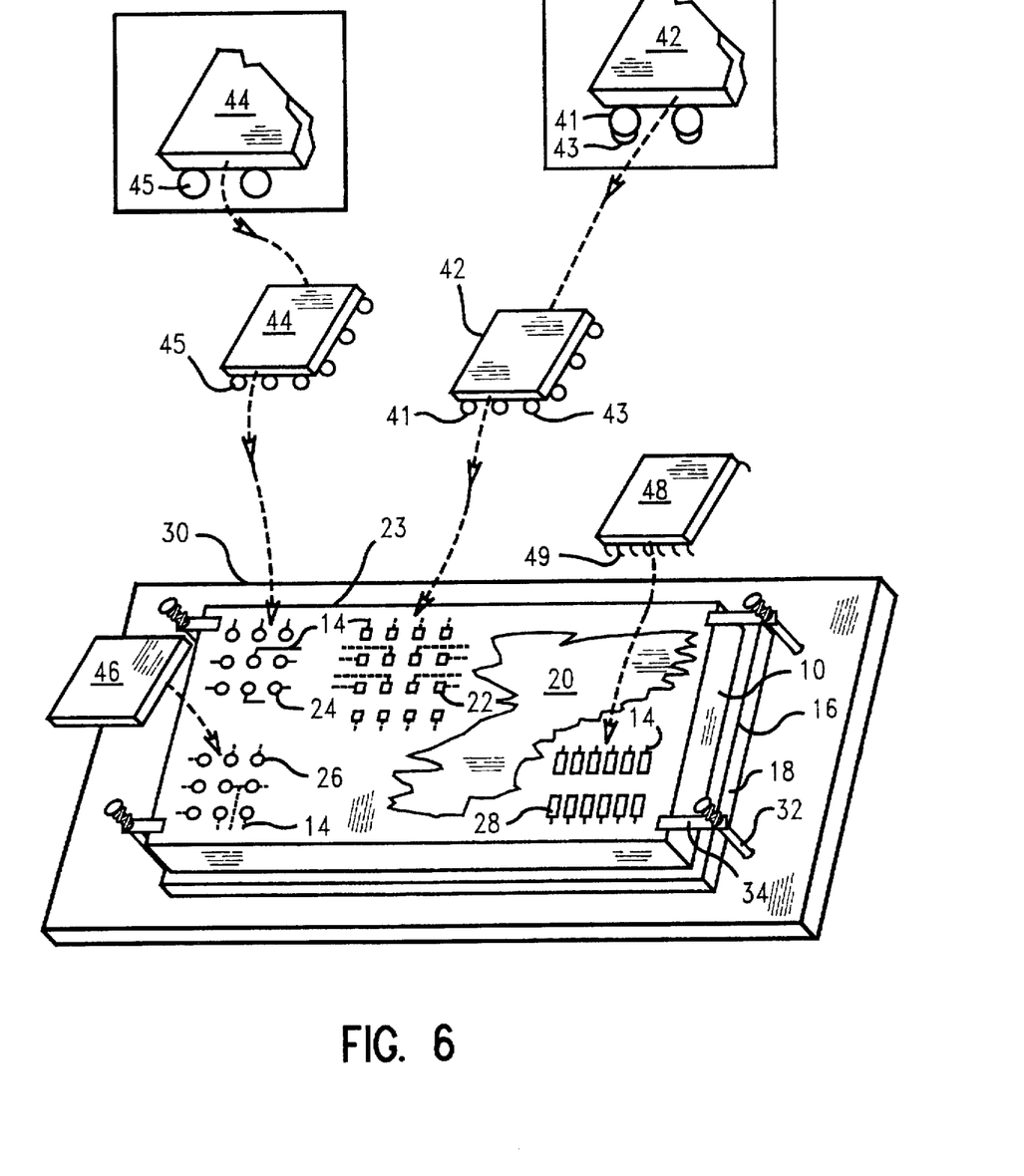
FIG. 6, shows the securing of one or more of electronic devices onto the site-dressed flexible circuit carrier card.

FIG. 6, shows the securing of one or more of electronic devices 42, 44, 46 and 48, onto the site-dressed flexible circuit carrier 23, which is itself secured to the jig 30. Depending upon the joining technology that is going to be used eutectic Pb—Sn solder is applied on the interconnects or pads 22, 24, 26 and 28. It is preferred that the eutectic solder paste is screened on the SMT pads 28, eutectic balls are placed for Ball Grid Array pads 26, and eutectic solder is injected on pads 24, for FCA, etc. A no clean solder flux is applied at the DCA/SOC sites 22.

An IC chip 42, having C4 solder balls 41, with tin Cap 43, is next aligned to the DCA/SOC chip site 22. Other electronic devices 44, 46 and 48, are aligned to their appropriate sites as shown in FIG. 6. For example, electronic device 44, with interconnects 45, is aligned with interconnect 24, electronic device 46, is aligned with interconnect 26, electronic device 48, with interconnects 49, is aligned with interconnect 28, etc. It should be obvious to artisan in the field, that the electronic devices may be discretes like resistors, capacitors, power supplies, IC chips or may be another package like Thin Quad Flat Pack (TQFP), Ball Grid Array (BGA) package, Tape Ball Grid Array (TBGA), amplifying device, circuit carrier card, etc.

This assembly is then reflowed, preferably, in a belt type furnace. However, heat for the solder reflow could be provided by at least one focused IR lamp. It is preferred that the belt speed and zone temperatures are adjusted so as to give a temperature profile where the assembly of FIG. 6, spends from about 3 to about 5 minutes above about 155° C., and, between about 15 to about 75 seconds at a maximum temperature of about 190° C. to about 230° C. The maximum reflow temperature for the solder is between about 190° C. and about 230° C. The solder reflow is above about 150° C for between about 2 to about 5 minutes. The time for solder reflow at maximum temperature is between about 15 to about 90 seconds. The solder reflow is preferably performed in an environment selected from a group comprising dry nitrogen, forming gas or hydrogen. It should be noted that the heat cycle required for joining this chip is identical to that required for SMT or for Ball Grid Array joining heat profiles, this adds the advantage of simultaneous reflow joining of SOC chips as well as SMT and/or BGA devices. For lower maximum temperature a higher time is required at the maximum temperature.

Figure 7:
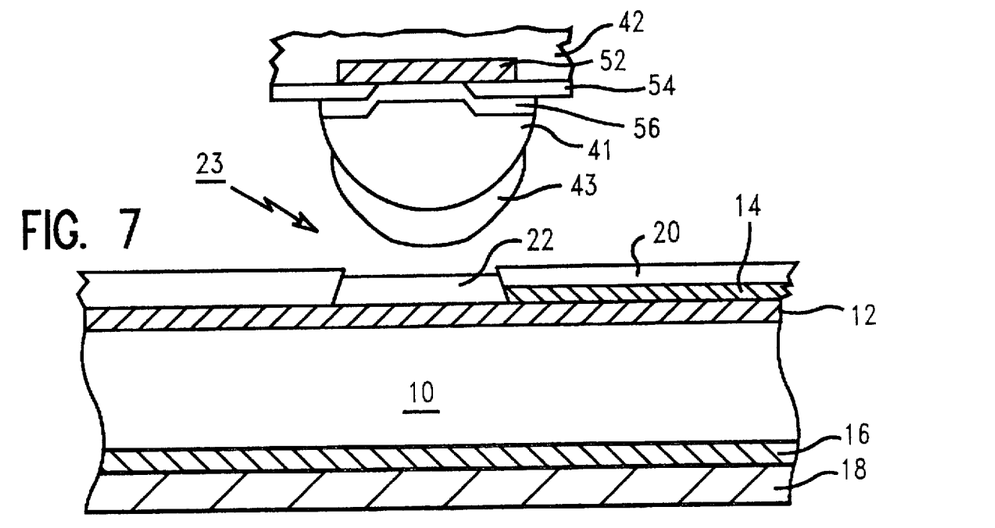
FIG. 7, shows an enlarged view of a solder ball interconnect having at least one metallic cap being secured to a single metallic pad.

FIG. 7, shows an enlarged view of chip 42, and DCA/SOC interconnection or pad 22, of FIG. 6. The chip or electronic device 42, has a solder ball 41, that has a cap of low melting point metal 43. The solder ball 41, is itself secured to a pad 52, via a BLM 56. Preferably, a layer of insulator 54, protects the surface of the chip 42. During the heating cycle the low melting point metal cap 43, on the solder ball 41, alloys with the solder ball 41, to form an eutectic composition 53, which melts at about 183° C. The volume of eutectic liquid is enough to envelope the exposed pad 22, such as, a copper pad 22, of flexible circuit carrier 23, and the surface tension of this eutectic liquid provides self aligning of the chip 42, to the exposed copper pad 22, on the flexible circuit carrier 23. The reflow temperature cycle evaporates the protective layer, if any, and also the flux, and hence no post cleaning is required.

Figure 8:
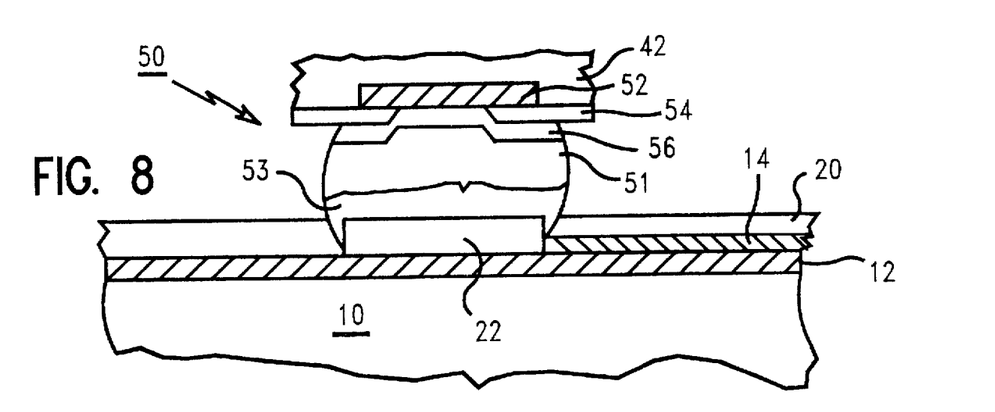
FIG. 8, shows an enlarged cross-sectional view of the solder interconnect of FIG. 7, secured to the metallic pad after the reflow operation.

FIG. 8, shows an enlarged cross-sectional view of a single interconnect of FIG. 7, after the chip joining operation creating chip-on-flex carrier 50. It can be clearly seen that the chip 42, has been secured to the flexible circuit carrier 23, and that an eutectic solder 53, has been formed between the interconnect pad 22, and solder 51.

Figure 9:
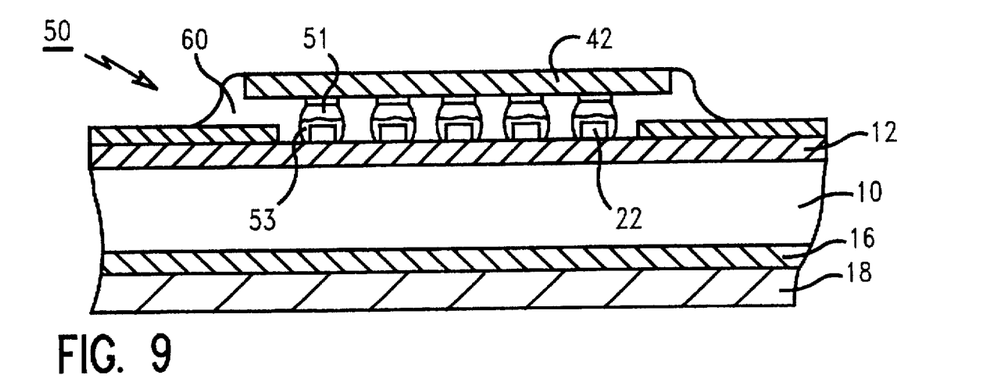
FIG. 9, is an enlarged cross-sectional view after at least one encapsulant has encapsulated at least one solder connection of FIG. 8.

FIG. 9 is an enlarged view of the electronic device or chip 42, after it has been joined to the flexible circuit carrier 23, forming the chip-on-flex carrier 50. In order to protect the electrical connections between the electronic device 42, such as, chip 42, and the flexible circuit carrier 23, suitable encapsulant 60, for example, HYSOL 4511, or an epoxy 60, can be provided under and over the electronic device or chip 42, and then cured. It has been found that the oxygen ashing step considerably improves the flow of the encapsulant under the chip 42. This encapsulant as shown in FIG. 9, primarily protects the electrical connection that is formed between the chip 42, and the flexible circuit carrier 23.

The solder ball 41, is preferably a high melting point solder ball, such as, for example, a solder ball with about 97 percent lead and about 3 percent tin, which is formed over the ball limiting metallurgy 56. The solder ball 41, could be formed either by evaporation or an electroplating methods of solder deposition. Before the inventive step of this invention is applied to the solder ball 41, it is preferred that all the processing steps of the semiconductor, such as, wafer testing, electrical testing have been completed and the solder has been re-flowed to bring it back to its spherical shape.

It should be apparent that the IC chip 42, could be a semiconductor wafer, wherein a plurality of devices (not shown) have been formed by conventional methods and interconnected through IC chip internal wires in one or more layers.

It is preferred that the high melting point solder ball is between about 2 percent to about 10 percent Sn, with the balance being Pb, on the chip with at least one capping layer of low melting point metal, such as, tin, thereby, providing eutectic solder at the tip of the high melting solder ball.

To those skilled in the art, it should be obvious that the flexible circuit carrier substrate 10, could be made of polyamide, polyester or polyethylene based material, in flexible form, with interlevel wiring (not shown) of one or more layers, and/or wiring channels on either or both surfaces.

The electronic devices typically have electrically conductive feature, such as pad, pins, etc., and wherein material for the electrically conductive features is selected from a group comprising Au, Co, Cr, Cu, Fe, Ni, TiW, phased Cr and Cu, and alloys thereof.

It is preferred that at least one layer of at least one low melting point metal is formed on the solder ball by a method selected from a group comprising Radio Frequency evaporation, E-beam evaporation, electroplating, electroless plating or injection.

And, wherein the at least one low melting point metal is selected from a group comprising of bismuth, indium, tin or alloys thereof.

It is preferred that at least one low melting point metal, caps between about 10 percent to about 90 percent of the exposed surface of the solder ball, and preferably caps between about 20 percent to about 80 percent of the exposed surface of the solder ball, and more preferably caps between about 30 percent to about 50 percent of the exposed surface of the solder ball. However, in some cased the low melting point metal could completely envelope the solder ball.

The average thickness of the at least one low melting point metal cap is between about 15 to about 50 micrometers.

It should be appreciated that other materials for the flexible circuit carrier could be used, such as, the material for the flexible circuit carrier could be selected from a group comprising polyimides, poly tetra flouro ethylene (PTFE), polyester or resin-impregnated fabrics, to name a few.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of directly attaching an electronic device onto a flexible circuit carrier, said method comprising the steps of:

(a) providing said electronic device with at least one at least one reflowed solder ball, wherein said, at least one reflowed solder ball has at least one coating of at least one low melting point metal to form a metallic cap, (b) adhering at least one layer of at least one stiffener sheet with at least one thermo-plastic adhesive onto at least one surface of a flexible sheet, (c) forming at least one electrically conductive metal line on said at least one surface of said flexible sheet, (d) coating at least a portion of said flexible carrier with at least one insulator material, and removing selective portions of said insulator material and exposing selective portions of said metal line, and forming a flexible circuit carrier, (e) screening eutectic solder paste to coat selective sites on said flexible circuit carrier, (f) placing said flexible circuit carrier on an assembly fixture to hold said flexible circuit carrier, (g) dispensing at least one solder flux at selective sites on said flexible circuit carrier, (h) aligning and placing said electronic device onto said flexible circuit carrier, such that said at least one reflowed solder ball with metallic cap makes contacts with said solder flux, and upon heating forms an electrical connection between said electronic device and said flexible circuit carrier.

2. The method of claim 1, wherein at least a portion of said electronic device is encapsulated with at least one epoxy.

3. The method of claim 1, wherein at least a portion of said flexible circuit carrier is encapsulated with at least one epoxy.

4. The method of claim 1, wherein at least a portion of the surface of said insulator material is roughened.

5. The method of claim 4, wherein said surface is roughened using oxygen plasma.

6. The method of claim 1, wherein a portion of said flexible circuit carrier is screened and reflowed using eutectic solder.

7. The method of claim 6, wherein said eutectic solder is deposited using a method selected from a group consisting of solder injection, electroplating, electroless plating, and decal placements.

8. The method of claim 1, wherein a portion of said flexible circuit carrier is screened and reflowed using eutectic solder, and wherein said eutectic solder provides screened ball grid array electrical connection.

9. The method of claim 1, wherein said electronic device is selected from a group consisting of an IC chip, a capacitor, a resistor, a circuit carrier card, a power supplier and an amplifying device.

10. The method of claim 1, wherein said flexible sheet is selected from a group consisting of organic substrate, multi-layer organic substrate, ceramic substrate and multi-layer ceramic substrate.

11. The method of claim 1, wherein said solder ball is selected from a group consisting of high melting point solder and low melting point solder.

12. The method of claim 1, wherein said solder ball is on an electrically conductive feature of said electronic device.

13. The method of claim 12, wherein material for said electrically conductive feature is selected from a group consisting of Au, Co, Cr, Cu, Fe, Ni, TiW, phased Cr and Cu, and alloys thereof.

14. The method of claim 12, wherein said electrically conductive feature is in electrical contact with at least one internal electrically conductive feature.

15. The method of claim 1, wherein said eutectic solder is selected from a group consisting of Pb, Bi, In, Sn, Ag, Au, and alloys thereof.

16. The method of claim 1, wherein said solder ball comprises of a lead-tin alloy, and wherein said alloy contains between about 2 percent to about 10 percent tin.

17. The method of claim 1, wherein said solder ball comprises of a lead-tin alloy, and wherein said alloy contains between about 90 percent to about 98 percent lead.

18. The method of claim 1, wherein said solder ball is formed on said electronic device using a method selected from the group consisting of evaporation, electroplating and solder injection.

19. The method of claim 1, wherein said at least one layer of at least one low melting point metal is formed on said solder ball by a method selected from a group consisting of Radio Frequency evaporation, E-beam evaporation, electroplating, electroless plating and injection.

20. The method of claim 1, wherein said at least one low melting point metal is selected from a group consisting of bismuth, indium, tin and alloys thereof.

21. The method of claim 1, wherein said at least one low melting point alloy is selected from a group consisting of lead, bismuth, indium, tin and alloys thereof.

22. The method of claim 1, wherein said at least one low melting point metal completely envelopes said solder ball.

23. The method of claim 1, wherein heat for said solder reflow is provided by at least one focused IR lamp.

24. The method of claim 1, wherein average thickness of said at least one low melting point metal cap is between about 15 to about 50 micro-meters.

25. The method of claim 1, wherein said at least one low melting point metal, caps between about 10 percent to about 90 percent of the exposed surface of said solder ball, and preferably caps between about 20 percent to about 80 percent of the exposed surface of said solder ball, and more preferably caps between about 30 percent to about 50 percent of the exposed surface of said solder ball.

26. The method of claim 1, where thickness of said at least one low melting point metal cap is chosen to provide a eutectic volume of between about 5 percent to about 50 percent of the volume of said solder ball, and preferably between about 10 percent to about 30 percent of the volume of said solder ball.

27. The method of claim 1, wherein at least a portion of said metal cap is secured to an electrically conductive feature on said flexible circuit carrier.

28. The method of claim 27, wherein material for said electrically conductive feature is selected from a group consisting of Au, Co, Cr, Cu, Fe, Ni, Ta, Ti, TiW, phased Cr and Cu, and alloys thereof.

29. The method of claim 1, wherein said flexible circuit carrier is selected from a group consisting of an interposer, a first level package, a PCMCIA card, a disc drive, a second level package, and a mother board.

30. The method of claim 1, wherein maximum reflow temperature for said solder is between about 190° and about 230° C.

31. The method of claim 1, wherein said step of solder reflow is above about 150° C. for between about 2 to about 5 minutes.

32. The method of claim 1, wherein time for solder reflow at maximum temperature is between about 15 to about 90 seconds.

33. The method of claim 1, wherein said solder reflow is performed in an environment selected from a group consisting of dry nitrogen, forming gas and hydrogen.

34. The method of claim 1, wherein said flexible circuit carrier is either a flexible organic laminated card or a flexible inorganic laminated card.

35. The method of claim 34, wherein material for said flexible organic circuit carrier is selected from a group consisting of polyimides, poly tetra flouro ethylene (PTFE), polyester and resin-impregnated fabrics.

36. The method of joining an electronic device, having C4 solder balls with tin cap, on a flexible circuit carrier of claim 1, comprising the steps of:

(a) aligning C4 balls of said electronic device with corresponding openings in said passivation layer of said flexible circuit carrier, (b) holding said electronic device in place by surface tension afforded by solder flux, and (c) reflowing said C4 solder to bond said electronic device to the flexible circuit carrier.

37. The method of claim 36, wherein at least a portion of said electronic device is encapsulated with at least one epoxy.

* * * * *